United States Patent
Chih et al.

(10) Patent No.: US 10,141,063 B2
(45) Date of Patent: Nov. 27, 2018

(54) MEMORY CONTROLLER, MEMORY DEVICE AND METHOD OF OPERATING

(71) Applicant: TAIWAN SEMICONDUCTOR MANUFACTURING COMPANY, LTD., Hsinchu (TW)

(72) Inventors: Yue-Der Chih, Hsinchu (TW); Cheng-Hsiung Kuo, Jhubei (TW); Gu-Huan Li, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 14/075,097

(22) Filed: Nov. 8, 2013

(65) Prior Publication Data
US 2015/0131372 A1     May 14, 2015

(51) Int. Cl.
G11C 16/34    (2006.01)
G11C 16/14    (2006.01)
G11C 16/24    (2006.01)

(52) U.S. Cl.
CPC .......... *G11C 16/3427* (2013.01); *G11C 16/14* (2013.01); *G11C 16/24* (2013.01)

(58) Field of Classification Search
None
See application file for complete search history.

(56) References Cited

U.S. PATENT DOCUMENTS 5,978,278 A * 11/1999 Lee .................. G11C 16/26
                                                365/185.24
2007/0258291 A1 * 11/2007 Lue ................. G11C 16/0466
                                                365/185.29

* cited by examiner

*Primary Examiner* — James G Norman
(74) *Attorney, Agent, or Firm* — Hauptman Ham, LLP

(57) ABSTRACT

A memory controller has a bit line driver configured to supply a selected bit line voltage to a selected bit line and an unselected bit line voltage to an unselected bit line. The selected bit line is coupled to a selected memory cell, and the unselected bit line is coupled to an unselected memory cell. The memory controller further has a word line driver configured to supply a selected word line voltage to a selected word line and an unselected word line voltage to an unselected word line. The selected word line is coupled to the selected memory cell, and the unselected word line is coupled to the unselected memory cell. The unselected bit line voltage is equal to or higher than a difference between the unselected word line voltage and a threshold voltage of the unselected memory cell.

20 Claims, 3 Drawing Sheets

MEMORY CONTROLLER, MEMORY DEVICE AND METHOD OF OPERATING

BACKGROUND

Processors and memories are parts of computing systems and electronic devices. The performance of a memory impacts the overall performance of the system or electronic device. Various circuits and/or operating methods are developed to improve one or more aspects of memory performance, such as access speed, power consumption, read margin, endurance, etc.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Figure 1:
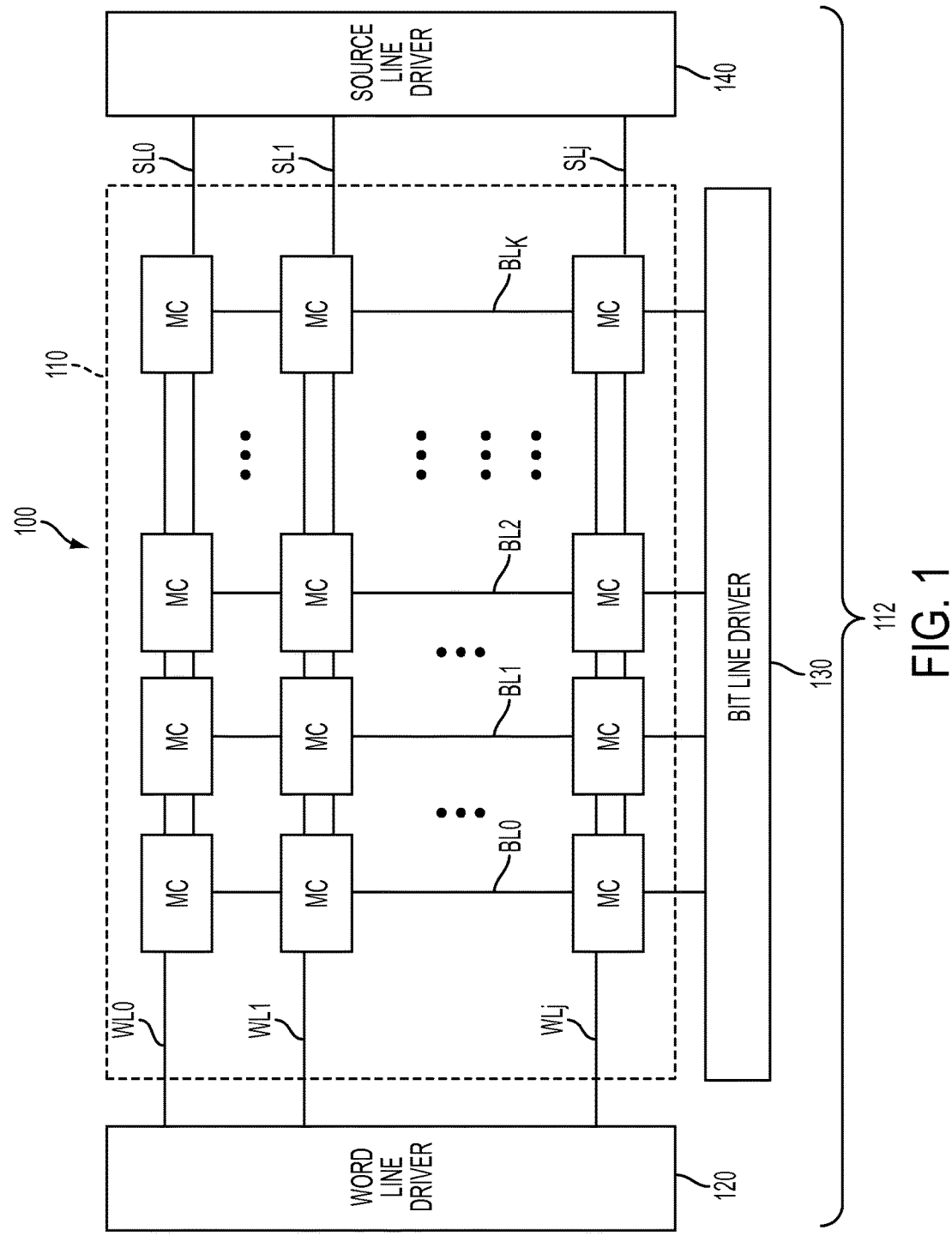
FIG. 1 is a block diagram of a memory device in accordance with some embodiments.

It is to be understood that the following disclosure provides many different embodiments or examples, for implementing different features of various embodiments. Specific examples of components and arrangements are described below to simplify the present disclosure. The inventive concept may; however, be embodied in many different forms and should not be construed as being limited to the embodiments set forth herein. It will be apparent, however, that one or more embodiments may be practiced without these specific details. Like reference numerals in the drawings denote like elements.

In some embodiments, in a write operation of a memory device, a selected bit line voltage is supplied to a selected bit line, and an unselected bit line voltage is supplied to other, unselected bit lines of the memory device. A selected word line voltage is supplied to a selected word line, and an unselected word line voltage is supplied to other, unselected word lines of the memory device. A selected memory cell coupled to the selected bit line and the selected word line is written with an intended logic state. A write disturb in a memory cell (referred to herein as write-inhibited memory cell) coupled to the selected bit line and an unselected word line is prevented or at least minimized by the unselected word line voltage supplied to the unselected word line. A leakage path through an unselected memory cell coupled to an unselected bit line and the unselected word line is prevented or at least minimized by the unselected bit line voltage supplied to the unselected bit line. As a result, the likelihood of a write disturb in the write-inhibited memory cell is further reduced. Compared to other approaches where the unselected bit lines are left floating during the write operation with possible leakage and write disturb, one or more embodiments where the unselected bit lines are supplied with an unselected bit line voltage achieve an improved endurance performance and/or a larger read margin.

FIG. 1 is a block diagram of a memory device 100 in accordance with some embodiments. The memory device 100 includes a memory array 110, and a memory controller 112. The memory array 110 includes a plurality of memory cells MC arranged in a plurality of rows and columns. The memory cells MC in each column are coupled to a corresponding one among a plurality of (k+1) bit lines BL0-BLk. The memory cells MC in each row are coupled to a corresponding one among a plurality of (j+1) word lines WL0-WLj and a corresponding one among a plurality of (j+1) source lines SL0-SLj. Various numbers of word lines and/or bit lines and/or source lines in the memory array 110 are within the scope of various embodiments. In at least one embodiment, the source lines are arranged in the columns, rather than in the rows as shown in FIG. 1.

In one or more embodiments, the memory cells MC include multiple time programmable (MTP) memory cells. Examples of MTP memory include, but are not limited to, electrically erasable programmable read-only memory (EEPROM), flash memory, Silicon-Oxide-Nitride-Oxide-Silicon (SONOS), ferroelectric random-access memory (FRAM), resistive RAM (RRAM), etc. In one or more embodiments, the memory cells MC include single-level memory cells each of which is configured to store 1 bit of data. In at least one embodiment, the memory cells MC include multi-level memory cells each of which is configured to store 2 or more bits of data. A threshold voltage of a memory cell MC depends on a logic state of data stored in the memory cell MC. For example, for a single-level memory cell, the threshold voltage when the memory cell is in an erased logic state (i.e., the memory cell stores a logic "1") is lower than when the memory cell is in a programmed state (i.e., the memory cell stores a logic "0"). For a multi-level memory cell, the memory cell has more than two threshold voltages corresponding to more than two logic states of the multi-level memory cell. The memory cell MCs are switchable between the logic states and have different threshold voltages corresponding to the logic states.

The memory controller 112 is configured to detect the threshold voltage of a memory cell MC, in a read operation, to read a datum stored in the memory cell MC. The memory controller 112 is further configured to write a datum, in a write operation, to a memory cell MC. In at least one embodiment, a write operation includes an erase operation (i.e., write "1") or a programing operation (i.e., write "0"). The memory controller 112 includes a word line driver 120, a bit line driver 130, and a source line driver 140 to perform a read operation or a write operation. In at least one embodiment, the memory controller 112 further includes one or more clock generators for providing clock signals for various components of the memory device 100, one or more input/output (I/O) units for data exchange with external devices, one or more sensing amplifiers for sensing data stored in the memory array 110, and/or one or more controllers for controlling various operations in the memory device 100. Other memory device configurations are within the scope of various embodiments.

The word line driver 120 is coupled to the memory array 110 via the word lines WL0-WLj. The word line driver 120 decodes a row address of the memory cell MC selected to be accessed in a read operation or a write operation. The word line driver 120 then supplies a voltage to the selected word line corresponding to the decoded row address, and a different voltage to the other, unselected word lines. The bit line driver 130 decodes a column address of the memory cell MC selected to be accessed. The bit line driver 130 then supplies a voltage to the selected bit line corresponding to the decoded column address, and a different voltage to the other, unselected bit lines. The source line driver 140 supplies a voltage to the selected source line corresponding to the selected memory cell MC, and a different voltage to the other, unselected source lines. A detailed description of the different voltages applied to the selected and unselected word lines, bit lines and source lines in accordance with some embodiments is given with respect to FIG. 3.

Figure 2:
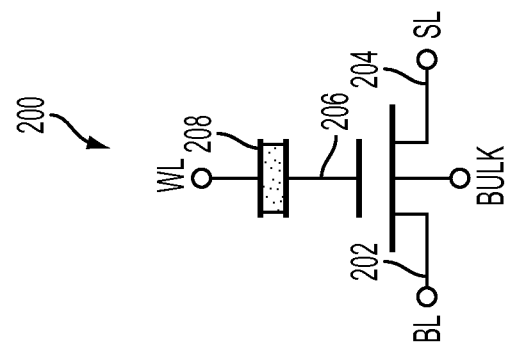
FIG. 2 is a schematic circuit diagram of a memory cell in accordance with some embodiments.

FIG. 2 is a schematic circuit diagram of a memory cell 200 in accordance with some embodiments. The memory cell 200 includes a first terminal 202 coupled to a bit line BL, a second terminal 204 coupled to a source line SL, and a control terminal 206 coupled to a word line WL via a coupling capacitor 208. In some embodiments, the coupling capacitor 208 is omitted. A substrate of the memory cell 200, when in use, is biased with a voltage BULK. In at least one embodiment, the voltage BULK is the ground. In at least one embodiment, the memory cell 200 corresponds to one of the memory cells MC, and the bit line BL, the source line SL and the word line WL correspond to one of the bit lines BL0-BLk, one of the word lines WL0-WLj, and one of the source lines SL0-SLj in, e.g., the memory device 100 described with respect to FIG. 1.

In at least one embodiment, the memory cell 200 includes a transistor. For example, the first terminal 202 is a drain, the second terminal 204 is a source and the control terminal 206 is a gate of the transistor. In some embodiments, the control terminal 206 includes a gate structure with a floating gate or a charge trapping layer. In a programing operation, a programming bit line voltage, a programming word line voltage and a programming source line voltage are supplied to the corresponding bit line BL, word line WL and source line SL to cause charge carriers (such as electrons) to be injected or tunneled into the gate structure of the control terminal 206, raising the threshold voltage of the memory cell 200. As a result, the memory cell 200 has a programed logic state or logic "0." In a specific example of an embodiment, the programming bit line voltage is a high voltage of, e.g., 7.8 V, the programming word line voltage is the high voltage of 7.8 V, and the programming source line voltage is 2.5 V.

In an erase operation, an erasing bit line voltage, an erasing word line voltage and an erasing source line voltage are supplied to the corresponding bit line BL, word line WL and source line SL to cause charge carriers (such as electrons) to be injected or tunneled out of the gate structure of the control terminal 206, reducing the threshold voltage of the memory cell 200. As a result, the memory cell 200 has an erased logic state or logic "1." In a specific example of an embodiment, the erasing bit line voltage is a high voltage of, e.g., 7.8 V, the erasing word line voltage is from 0.1 V to 0.5 V, and the erasing source line voltage is 0 V. In some embodiments, the programing and erasing voltages are supplied to the bit line BL, word line WL and source line SL by the corresponding bit line driver, word line driver and source line driver as described with respect to FIG. 1.

Figure 3:
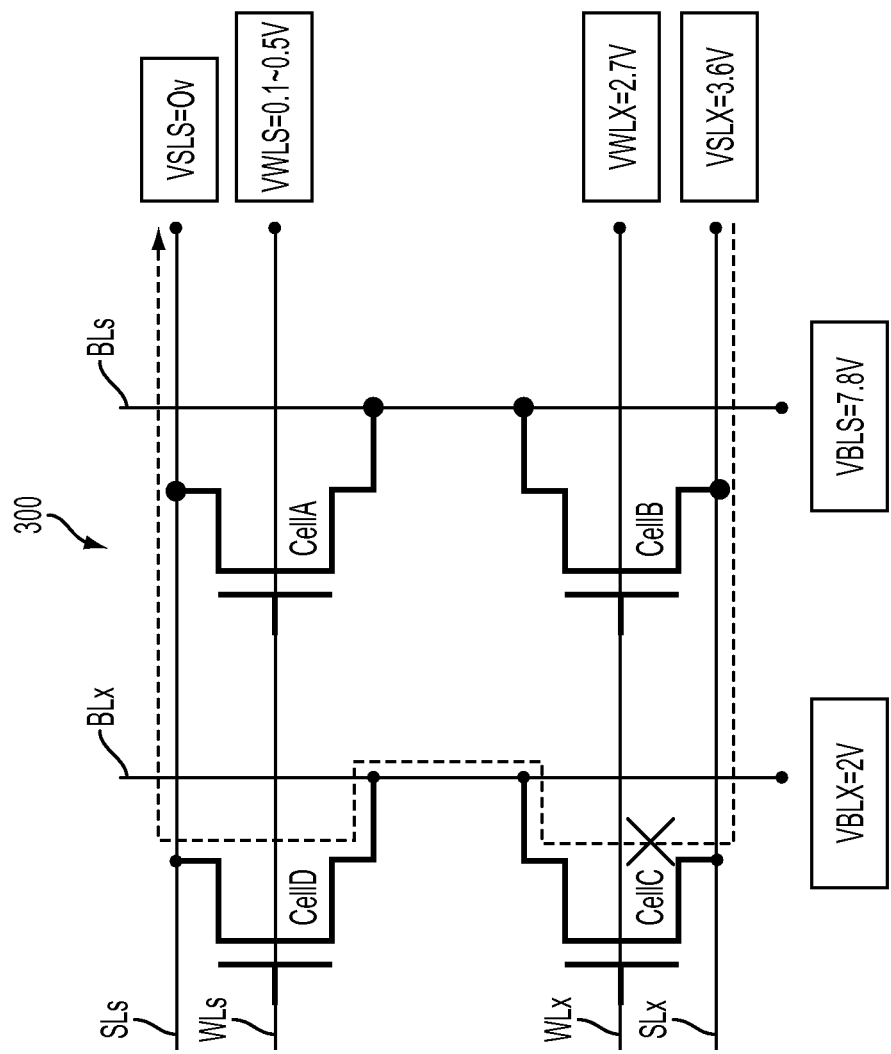
FIG. 3 is a schematic circuit diagram of a segment of a memory device in accordance with some embodiments.

FIG. 3 is a schematic circuit diagram of a segment of a memory device 300 in accordance with some embodiments. The memory device 300 includes a memory controller and a plurality of memory cells arranged in a memory array as described with respect to FIG. 1. Four memory cells Cell A, Cell B, Cell C and Cell D of the memory device 300 and the corresponding bit lines BLs, BLx, word lines WLs, WLx, and source lines SLs, SLx are shown in FIG. 3. A first terminal, a second terminal and a control terminal of Cell A are coupled to the corresponding bit line BLs, source line SLs and word line WLs as described with respect to FIG. 2. Similarly, the terminals of Cell B are coupled to the corresponding bit line BLs, source line SLx and word line WLx, the terminals of Cell C are coupled to the corresponding bit line BLx, source line SLx and word line WLx, and the terminals of Cell D are coupled to the corresponding bit line BLx, source line SLs and word line WLs. The bit lines BLs, BLx, word lines WLs, WLx, and source lines SLs, SLx are coupled to the corresponding bit line driver, word line driver and source line driver of the memory controller of the memory device 300 as described with respect to FIG. 1. For simplicity, FIG. 3 shows the bit lines BLs, BLx as immediately adjacent bit lines, the source lines SLs, SLx as immediately adjacent source lines, and the word lines WLs, WLx as immediately adjacent word lines. It is possible in at least one embodiment that one or more other bit lines are arranged between the bit lines BLs, BLx, and/or one or more other source lines are arranged between the source lines SLs, SLx, and/or one or more other word lines are arranged between the word lines WLs, WLx.

A write operation, such as an erase operation, of the memory device 300 is described below.

A memory cell is selected to be written to in the write operation. For example, Cell A is a selected memory cell. The bit line, word line and source line coupled to the selected memory cell are the selected bit line, selected word line and selected source line. For example, the bit line BLs, word line WLs and source line SLs coupled to the selected Cell A are the selected bit line, selected word line and selected source line. The bit lines, word lines and source lines not coupled to the selected memory cell are unselected bit lines, unselected word lines and unselected source lines. For example, the bit line BLx, word line WLx and source line SLx not coupled to the selected Cell A are the unselected bit line, unselected word line and unselected source line. Memory cells coupled to the unselected bit lines are referred to as unselected memory cells. For example, Cell C and Cell D coupled to the unselected bit line BLx are unselected memory cells. Memory cells coupled to the selected bit line and other than the selected memory cell are referred to as write-inhibited memory cells. For example, Cell B is a write-inhibited memory cell.

The bit line driver supplies a selected bit line voltage to a selected bit line and an unselected bit line voltage to unselected bit lines of the memory device 300. For example, a selected bit line voltage VBLs is supplied to the selected bit line BLs, and an unselected bit line voltage VBLx is supplied to the unselected bit line BLx. The word line driver supplies a selected word line voltage to a selected word line and an unselected word line voltage to unselected word lines. For example, a selected word line voltage VWLs is supplied to the selected word line WLs and an unselected word line voltage VWLx is supplied to the unselected word line WLx. The source line driver supplies a selected source line voltage to a selected source line and an unselected source line voltage to unselected source lines. For example, a selected source line voltage VSLs is supplied to the selected source line SLs and an unselected source line voltage VSLx is supplied to the unselected source line SLx.

The selected bit line voltage VSLs, the selected word line voltage VWLs and the selected source line voltage VSLs cause a logic state, e.g., the erased logic state of "1", to be written to the selected Cell A. In a specific example of an embodiment as described with respect to FIG. 2 and indicated in FIG. 3, the selected bit line voltage VSLs is 7.8 V, the selected word line voltage VWLs is 0.1-0.5 V, and the selected source line voltage VSLs is 0 V.

The presence of the selected bit line voltage VBLs on the selected bit line BLs creates a condition for a write disturb in memory cells, such as Cell B, which are coupled to the selected bit line voltage VBLs and other than the selected memory cell. A write disturb includes a "soft program" or a "soft erase." A soft program occurs when the threshold voltage of a memory cell is slightly increased. If the memory cell has a low threshold voltage (e.g., when the memory cell has the erased logic state), repeated occurrences of soft program gradually increase the threshold voltage of the memory cell to a level where it is possible that the memory controller incorrectly determines the logic state of the memory cell as a programed logic state. A soft erase occurs when the threshold voltage of the memory cell is slightly decreased. If the memory cell has a high threshold voltage (e.g., when the memory cell has the programed logic state), repeated occurrences of soft erase gradually decrease the threshold voltage of the memory cell to a level where it is possible that the memory controller incorrectly determines the logic state of the memory cell as an erased logic state.

In some embodiments, a write disturb in Cell B is prevented or at least minimized by supplying the unselected word line voltage VWLx and/or the unselected source line voltage VSLx to Cell B. Cell B is therefore referred to as a write-inhibited memory cell. In at least one embodiment, the unselected word line voltage VWLx is selected to be in a range between the selected word line voltage VWLs and the high voltage which is also the programming word line voltage. In a specific example of an embodiment, the unselected word line voltage VWLx is 2.7 V which is between the selected word line voltage VWLs of 0.1~0.5 V and the high voltage of 7.8 V. If the unselected word line voltage VWLx is increased, the likelihood of soft program in the write-inhibited Cell B is increased and the power consumption of the memory device 300 is also increased. If the unselected word line voltage VWLx is decreased, the likelihood of soft erase in the write-inhibited Cell B is increased. In at least one embodiment, the unselected source line voltage VSLx is selected to be in a range between the source line voltage for programming the memory cell and the high voltage. In a specific example of an embodiment, the unselected source line voltage VSLx is 3.6 V which is between the programming source line voltage of 2.5 V and the high voltage of 7.8 V. If the unselected source line voltage VSLx is increased, the power consumption of the memory device 300 is increased. If the unselected source line voltage VSLx is decreased, the likelihood of soft program in the write-inhibited Cell B is increased.

The unselected word line voltage VWLx and the unselected source line voltage VSLx for preventing or minimizing a write disturb in the write-inhibited Cell B are supplied via the corresponding unselected word line WLx and unselected source line SLx to the unselected Cell C. The unselected word line voltage VWLx and the unselected source line voltage VSLx create a condition for a leakage path through the unselected Cell C. If the unselected Cell C has a low threshold voltage (e.g., the unselected Cell C has an erased logic state) and if the unselected bit line BLx is floating, a leakage path is created from the unselected source line SLx, through the unselected Cell C to the unselected bit line BLx. If the unselected Cell D also has a low threshold voltage (e.g., the unselected Cell D has an erased logic state), the leakage path further extends through the unselected Cell D to the selected source line SLs, as indicated by the dot-dot line in FIG. 3. Such a leakage path potentially causes a decrease in the unselected source line voltage VSLx which, in turn, potentially causes a write disturb in the write-inhibited Cell B.

In some embodiments, the unselected bit line voltage VBLx, which is equal to or higher than a difference between the unselected word line voltage VWLx and a threshold voltage of the unselected Cell C, is supplied to the unselected bit line BLx. As a result, the leakage path through the unselected Cell C is cut off, as indicated by the X mark in FIG. 3. In at least one embodiment, the threshold voltage of the unselected Cell C is a low threshold voltage corresponding to the erased logic state. In a specific example of an embodiment, the threshold voltage of the unselected Cell C corresponding to the erased logic state is 0.7 V, the unselected word line voltage VWLx is 2.7 V, and the unselected bit line voltage VBLx supplied to the unselected bit line BLx to cutoff the leakage path through the unselected Cell C is equal to or greater than 2 V. In at least one embodiment, the unselected bit line voltage VBLx is lower than the selected bit line voltage VBLs which, in a specific example of an embodiment, is 7.8 V. If the unselected bit line voltage VBLx is lower than the difference between the unselected word line voltage VWLx and the threshold voltage of the unselected Cell C, a leakage path through the unselected Cell C is possible. If the unselected bit line voltage VBLx is increased, the power consumption of the memory device 300 is increased. By selecting an appropriate value for the unselected bit line voltage VBLx, it is possible to cut off a leakage path through the unselected Cell C without excessive power consumption. Because a leakage path through the unselected Cell C is cut off, it is possible to maintain the unselected source line voltage VSLx at the level sufficient to inhibit, or at least minimize a write disturb in the write-inhibited Cell B. The reduced likelihood of write disturbs achievable in accordance with some embodiments improves the endurance performance and/or read margin of the memory device 300, compared to other approaches where the unselected bit lines are left floating during the erase operation.

Although specific voltage values are given in the foregoing description and in FIG. 3, the disclosure is not limited thereto. Other voltage values are within the scope of various embodiments, depending on various factors including, but not limited to, configurations, applications, and operational conditions of memory devices.

Figure 4:
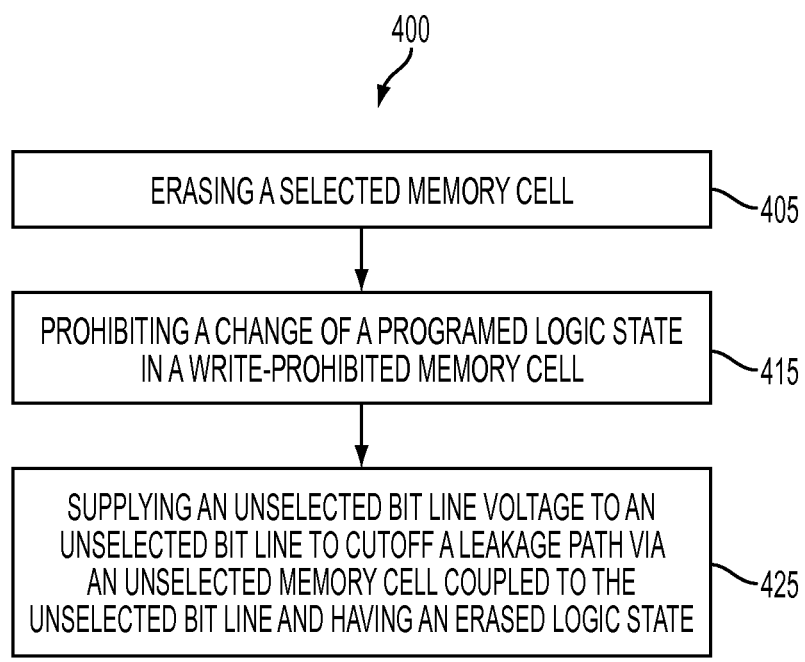
FIG. 4 is a flow chart of a method of operating a memory device in accordance with some embodiments.

FIG. 4 is a flow chart of a method 400 of operating a memory device in accordance with some embodiments. In at least one embodiment, the method 400 is performed in the memory device 300.

At operation 405, a selected memory cell among memory cells of the memory device is erased. For example, the selected Cell A of the memory device 300 is erased by supplying the corresponding selected bit line voltage VBLs, selected word line voltage VWLs and selected source line voltage VSLs to the selected bit line BLs, selected word line WLs and selected source line SLs, as described with respect to FIG. 3.

At operation 415, a change of a programed logic state in a write-inhibited memory cell among the memory cells of the memory device is inhibited. For example, a change to a programed logic state in the write-inhibited Cell B is inhibited by supplying the corresponding unselected word line voltage VWLx and/or unselected source line voltage VSLx to the unselected word line WLx and/or unselected source line SLx, as described with respect to FIG. 3.

At operation 425, an unselected bit line voltage is supplied to an unselected bit line to cutoff a leakage path from the unselected source line to the selected source line via the unselected bit line and an unselected memory cell coupled to the unselected bit line. For example, the unselected bit line voltage VBLx is supplied to the unselected bit line BLx to cutoff a leakage path from the unselected source line SLx to the selected source line SLs via the unselected bit line BLx and the unselected Cell C and Cell D coupled to the unselected bit line BLx, as described with respect to FIG. 3.

The above method embodiment shows example operations, but they are not necessarily required to be performed in the order shown. For example, in at least one embodiment, operations 405, 415 and 425 are performed at the same time. In some embodiments, operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

According to some embodiments, a memory controller for a memory device comprises a word line driver configured to be coupled to memory cells of the memory device via corresponding word lines, and a bit line driver configured to be coupled to the memory cells via corresponding bit lines. In a write operation, the bit line driver is configured to supply a selected bit line voltage to a selected bit line among the bit lines and supply an unselected bit line voltage to an unselected bit line among the bit lines. The selected bit line is coupled to a memory cell selected to be written to among the memory cells, and the unselected bit line is coupled to a memory cell unselected to be written to among the memory cells. The word line driver is configured to supply a selected word line voltage to a selected word line among the word lines and supply an unselected word line voltage to an unselected word line among the word lines. The selected word line is coupled to the selected memory cell, and the unselected word line is coupled to the unselected memory cell. The unselected bit line voltage is equal to or higher than a difference between the unselected word line voltage and a threshold voltage of the unselected memory cell.

According to some embodiments, a memory device comprises word lines, bit lines, source lines, MTP memory cells coupled to the corresponding word lines, bit lines and source lines, and a memory controller coupled to the memory cells via the corresponding word lines, bit lines and source lines. The memory controller is configured to, in an erase operation, erase a selected memory cell among the memory cells, and inhibit a change of a logic state in a write-inhibited memory cell among the memory cells. The write-inhibited memory cell and the selected memory cell are coupled to a selected bit line among the bit lines, and the write-inhibited memory cell is coupled to an unselected source line among the source lines. The memory controller is further configured to cutoff a leakage path from the unselected source line to an unselected bit line among the bit lines via an unselected memory cell among the memory cells. The unselected memory cell is coupled to the unselected bit line and the unselected source line.

According to some embodiments, a method of operating a memory device comprises an erase operation in which a selected memory cell among memory cells of the memory device is erased, and a change of a programed logic state in a write-inhibited memory cell among the memory cells is inhibited. The write-inhibited memory cell and the selected memory cell are coupled to a selected bit line. The write-inhibited memory cell is coupled to an unselected source line, and the selected memory cell is coupled to a selected source line. In the erase operation, an unselected bit line voltage is supplied to an unselected bit line to cutoff a leakage path from the unselected source line to the selected source line via the unselected bit line and an unselected memory cell coupled to the unselected bit line. The unselected memory cell has an erased logic state.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A device, comprising:
   a memory cell array having memory cells arranged in rows and columns;
   a word line driver configured to be coupled to the memory cells of a memory device via corresponding word lines;
   a bit line driver configured to be coupled to the memory cells via corresponding bit lines;
   source lines coupled to the memory cells; and
   a number of source lines equals a number of rows in the memory cell array;
   wherein, in a programming operation,
      the bit line driver is configured to supply a selected bit line voltage to a selected bit line among the bit lines and supply an unselected bit line voltage to an unselected bit line among the bit lines, the selected bit line coupled to a memory cell in the memory cells, and selected to be written to among the memory cells, the unselected bit line coupled to a memory cell unselected to be written to among the memory cells,
      the word line driver is configured to supply a selected word line voltage to a selected word line among the word lines and supply an unselected word line voltage, different from the selected word line voltage, to an unselected word line among the word lines, the selected word line coupled to the selected memory cell, the unselected word line coupled to the unselected memory cell, wherein
      the unselected bit line voltage is equal to or higher than a difference between the unselected word line voltage and a lower threshold voltage of the unselected memory cell.

2. The device of claim 1, wherein
   the memory cells are switchable between a first logic state corresponding to the lower threshold voltage and a second logic state corresponding to a higher threshold voltage.

3. The device of claim 2, wherein the bit line driver and the word line driver are configured to supply a corresponding selected bit line voltage and selected word line voltage to write the first logic state to the selected memory cell.

4. The device of claim 1, wherein
   the memory cells include a write-inhibited memory cell coupled to the selected bit line and the unselected word line, and
   the word line driver is configured to supply the unselected word line voltage to prevent a logic state of the write-inhibited memory cell from being changed by the selected bit line voltage in the programming operation.

5. The device of claim 4, further comprising:
a source line driver configured to be coupled to the memory cells via corresponding source lines,
wherein in the programming operation, the source line driver is configured to supply a selected source line voltage to a selected source line among the source lines and supply an unselected source line voltage to an unselected source line among the source lines,
the selected source line coupled to the selected memory cell,
the unselected source line coupled to the unselected memory cell, and
the selected source line voltage is lower than the unselected source line voltage.

6. The device of claim 5, wherein
the write-inhibited memory cell is coupled to the unselected source line, and
the source line driver and the word line driver are configured to supply the corresponding unselected source line voltage and unselected word line voltage to prevent the logic state of the write-inhibited memory cell from being changed by the selected bit line voltage in the programming operation.

7. The device of claim 6, wherein
the bit line driver, the source line driver and the word line driver are configured to supply the corresponding unselected bit line voltage, unselected source line voltage and unselected word line voltage to cutoff a leakage path from the unselected source line to the unselected bit line via the unselected memory cell in the programming operation.

8. The device of claim 1, wherein the unselected bit line voltage is lower than the selected bit line voltage.

9. A device, comprising:
word lines, bit lines and source lines;
a memory cell array having multiple time programmable (MTP) memory cells coupled to the corresponding word lines, bit lines and source lines, the MTP memory cells arranged in rows and columns;
a number of source lines equals a number of rows in the memory cell array; and
a memory controller coupled to the MTP memory cells via the corresponding word lines, bit lines and source lines,
the memory controller configured to, in a programming operation,
write a logic state to a selected memory cell among the MTP memory cells,
inhibit a change of a logic state in a write-inhibited memory cell among the MTP memory cells, wherein the write-inhibited memory cell among the MTP memory cells and the selected memory cell among the MTP memory cells are coupled to a selected bit line among the bit lines,
supply an unselected word line voltage to an unselected word line coupled to an unselected memory cell among the MTP memory cells, and
supply an unselected bit line voltage to an unselected bit line, wherein the unselected bit line voltage is equal to or higher than a voltage difference between the unselected word line voltage and a lower threshold voltage of the unselected memory cell among the MTP memory cells.

10. The device of claim 9, wherein, in the programming operation,
the logic state of the write-inhibited memory cell among the MTP memory cells is a programmed logic state, and a logic state of the unselected memory cell among the MTP memory cells is an erased logic state.

11. The device of claim 9, wherein
in the programming operation, the memory controller is further configured to supply
a selected bit line voltage to the selected bit line,
a selected source line voltage to a selected source line among the source lines,
an unselected source line voltage to an unselected source line,
a selected word line voltage to a selected word line among the word lines, and
the unselected word line voltage to the unselected word line among the word lines,
the selected memory cell among the MTP memory cells is coupled to the selected source line and the selected word line, and
the write-inhibited memory cell among the MTP memory cells and the unselected memory cell among the MTP memory cells are coupled to the unselected word line.

12. The device of claim 9, wherein the unselected bit line voltage is two volts and the voltage difference between the unselected word line voltage and the lower threshold voltage of the unselected memory cell among the MTP memory cells is two volts.

13. The device of claim 11, wherein the unselected bit line voltage is lower than the selected bit line voltage.

14. The device of claim 11, wherein
the unselected source line voltage is higher than the selected source line voltage, and
the unselected word line voltage is higher than the selected word line voltage.

15. The device of claim 9, wherein
in the programing operation, the memory controller is configured to supply a programming word line voltage, a programming bit line voltage and a programming source line voltage to the corresponding selected word line, selected bit line and selected source line, and
the programming word line voltage is higher than the unselected word line voltage.

16. A method, comprising:
programming a selected memory cell among memory cells of a memory device, the memory cells being part of a memory cell array arranged in rows and columns, the memory cells being coupled to source lines, and a number of source lines equals a number of rows in the memory cell array;
during the programming, inhibiting a change of a programmed logic state in a write-inhibited memory cell among the memory cells, wherein the write-inhibited memory cell among the memory cells and the selected memory cell among the memory cells are coupled to a selected bit line, the write-inhibited memory cell among the memory cells is coupled to an unselected source line of the source lines, and the selected memory cell among the memory cells is coupled to a selected source line of the source lines; and
supplying an unselected bit line voltage to an unselected bit line, wherein the unselected bit line voltage is equal to or higher than a difference between an unselected word line voltage and a lower threshold voltage of an unselected memory cell among the memory cells.

17. The method of claim 16, wherein
the programming comprises supplying
a selected bit line voltage to the selected bit line,
a selected source line voltage to the selected source line of the source lines, and a selected word line voltage to a selected word line coupled to the selected memory cell among the memory cells, and the inhibiting comprises supplying the unselected word line voltage to an unselected word line coupled to the write-inhibited memory cell among the memory cells and the unselected memory cell among the memory cells, and an unselected source line voltage to the unselected source line of the source lines.

18. The method of claim 17, wherein the unselected bit line voltage is lower than the selected bit line voltage.

19. The method of claim 17, wherein the unselected source line voltage is higher than the selected source line voltage, and the unselected word line voltage is higher than the selected word line voltage.

20. The method of claim 17, wherein the programing comprises:

supplying a programming word line voltage, a programming bit line voltage and a programming source line voltage to the corresponding selected word line, selected bit line and selected source line, wherein the programming word line voltage is higher than the unselected word line voltage.

* * * * *